US011462405B2

(12) United States Patent
Komatsu et al.

(10) Patent No.: US 11,462,405 B2
(45) Date of Patent: Oct. 4, 2022

(54) PATTERN-FORMING METHOD AND PATTERNED SUBSTRATE

(71) Applicant: JSR CORPORATION, Tokyo (JP)

(72) Inventors: Hiroyuki Komatsu, Tokyo (JP); Miki Tamada, Tokyo (JP); Hitoshi Osaki, Tokyo (JP); Tomoki Nagai, Tokyo (JP)

(73) Assignee: JSR CORPORATION, Tokyo (JP)

( * ) Notice: Subject to any disclaimer, the term of this patent is extended or adjusted under 35 U.S.C. 154(b) by 400 days.

(21) Appl. No.: 16/597,947

(22) Filed: Oct. 10, 2019

(65) Prior Publication Data

US 2020/0118819 A1 Apr. 16, 2020

(30) Foreign Application Priority Data

Oct. 10, 2018 (JP) .............................. JP2018-192142
Oct. 7, 2019 (JP) .............................. JP2019-184776

(51) Int. Cl.
*G03F 7/075* (2006.01)
*H01L 21/033* (2006.01)
*B81C 1/00* (2006.01)
*G03F 7/26* (2006.01)
*H01L 21/308* (2006.01)

(52) U.S. Cl.
CPC ...... *H01L 21/0337* (2013.01); *B81C 1/00031* (2013.01); *G03F 7/0757* (2013.01); *G03F 7/26* (2013.01); *H01L 21/3086* (2013.01); *B81C 2201/0149* (2013.01)

(58) Field of Classification Search
CPC . G03F 7/0751; G03F 7/16; G03F 7/26; B81C 2201/0149
See application file for complete search history.

(56) References Cited

U.S. PATENT DOCUMENTS

2009/0214823 A1 8/2009 Cheng et al.
2015/0166821 A1* 6/2015 Yi ........................... G03F 7/168
430/324

FOREIGN PATENT DOCUMENTS

| JP | 2002-519728 A | 7/2002 |
| JP | 2003-218383 A | 7/2003 |
| JP | 2008-036491 A | 2/2008 |
| JP | 2008-149447 A | 7/2008 |
| JP | 2010-058403 A | 3/2010 |
| JP | 2012-174984 A | 9/2012 |

* cited by examiner

*Primary Examiner* — Daborah Chacko-Davis
(74) *Attorney, Agent, or Firm* — Oblon, McClelland, Maier & Neustadt, L.L.P.

(57) ABSTRACT

A pattern-forming method includes forming a prepattern and including a first polymer is formed on a silicon-containing film on a substrate. An underlayer film including a second polymer is formed in recessed portions of the prepattern. A composition for directed self-assembled film formation including a third polymer is applied on the underlayer film and the prepattern. The first polymer includes a first structural unit. The second polymer includes: a molecular chain including the first structural unit and a second structural unit that differs from the first structural unit; and an end structure that bonds to one end of the molecular chain and includes at least one selected from the group consisting of an amino group, a hydroxy group and a carboxy group. The third polymer is a block copolymer including a block of the first structural unit and a block of the second structural unit.

20 Claims, 2 Drawing Sheets

PATTERN-FORMING METHOD AND PATTERNED SUBSTRATE

CROSS-REFERENCE TO RELATED APPLICATIONS

The present application claims priority to Japanese Patent Application No. 2018-192142, filed Oct. 10, 2018, and to Japanese Patent Application No. 2019-184776, filed Oct. 7, 2019. The contents of these applications are incorporated herein by reference in their entirety.

BACKGROUND OF THE INVENTION

Field of the Invention

The present invention relates to a pattern-forming method and a patterned substrate.

Discussion of the Background

Microfabrication of structures of various types of electronic devices such as semiconductor devices and liquid crystal devices has been accompanied by demands for miniaturization of patterns formed. In these days, fine patterns having a line width of about 90 nm can be formed using, for example, an ArF excimer laser; however, further finer pattern formation has been demanded.

To meet such demands, a pattern-forming method which utilizes a phase separation structure constructed through directed self-assembly, as generally referred to, that spontaneously forms an ordered pattern has been proposed. As such a pattern-forming method, a method for forming an ultrafine pattern by directed self-assembly using a block copolymer formed by copolymerization of monomers having different properties from one another has been known (see Japanese Unexamined Patent Application, Publication No. 2008-149447, Japanese Unexamined Patent Application (Translation of PCT Application), Publication No. 2002-519728, and Japanese Unexamined Patent Application, Publication No. 2003-218383). According to this method, annealing of a film containing the block copolymer results in a tendency of clustering of polymer structures having the same property, and thus a pattern can be formed in a self-assembling manner. In addition, a method of forming a fine pattern by permitting directed self-assembly of a composition that contains a plurality of polymers having properties that are different from one another has been also known (see U.S. Patent Application, Publication No. 2009/0214823, and Japanese Unexamined Patent Application, Publication No. 2010-58403).

It has been known that in such a pattern-forming method, forming on an underlayer film, a film containing a component such as a polymer which should be subjected to the directed self-assembly may effectively cause micro-phase separation to form a structure of the directed self-assembly described above. A variety of studies have been made in connection with the underlayer film, and formation of a variety of phase separation structures is reportedly enabled by appropriately controlling the surface free energy of the underlayer film in permitting the directed self-assembly of the block copolymer (see Japanese Unexamined Patent Application, Publication No. 2008-36491, and Japanese Unexamined Patent Application, Publication No. 2012-174984).

SUMMARY OF THE INVENTION

According to an aspect of the present invention, a pattern-forming method includes forming a silicon-containing film on a substrate. A prepattern having recessed portions and including a first polymer is formed directly or indirectly on the silicon-containing film. An underlayer film including a second polymer is formed in the recessed portions of the prepattern. A composition for directed self-assembled film formation including a third polymer is applied on the underlayer film and the prepattern to form a coating film. Phase separation of the coating film is allowed to form a directed self-assembled film having phases. At least a part of the phases of the directed self-assembled film is removed to form a pattern. The substrate is etched using the pattern as a mask. The first polymer includes a first structural unit. The second polymer includes: a molecular chain including the first structural unit and a second structural unit that differs from the first structural unit; and an end structure that bonds to one end of the molecular chain and includes at least one selected from the group consisting of an amino group, a hydroxy group and a carboxy group. The third polymer is a block copolymer including a block of the first structural unit and a block of the second structural unit. The first structural unit is derived from a first monomer, and the second structural unit is derived from a second monomer that is more polar than the first monomer.

According to another aspect of the present invention, a patterned substrate is obtained by the pattern-forming method.

DESCRIPTION OF EMBODIMENTS

Figure 1:
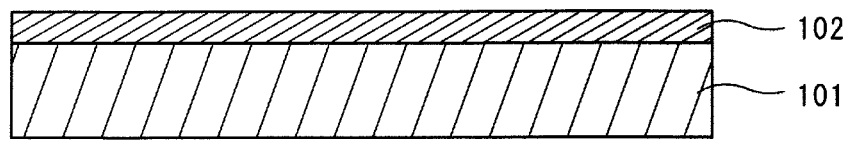
FIG. 1 is a schematic cross sectional view illustrating one example of a state after forming a silicon-containing film directly or indirectly on an upper face side of a substrate in the pattern-forming method of the embodiment of the present invention.

According to one embodiment of the invention made for solving the aforementioned problems, a pattern-forming method comprises the steps of: forming a silicon-containing film on a substrate (hereinafter, may be also referred to as "silicon-containing film-forming step"); as forming a prepattern comprising a first polymer (hereinafter, may be also referred to as "(P) polymer" or "polymer (P)") directly or indirectly on the silicon-containing film (hereinafter, may be also referred to as "prepattern-forming step"); forming an underlayer film comprising a second polymer (hereinafter, may be also referred to as "(A) polymer" or "polymer (A)") in recessed portions of the prepattern (hereinafter, may be also referred to as "underlayer film-forming step"); applying on the underlayer film and the prepattern, a composition for directed self-assembled film formation comprising a third polymer (hereinafter, may be also referred to as "(X) polymer" or "polymer (X)") (hereinafter, may be also referred to as "applying step"); allowing phase separation of a coating film formed by the applying (hereinafter, may be also referred to as "phase separation step"); removing at least a part of phases of a directed self-assembled film formed by the phase separation to form a pattern (hereinafter, may be also referred to as "removing step"); and etching the substrate using the pattern formed by the removing (hereinafter, may be also referred to as "etching step"), wherein, the first polymer is a polymer comprising a first structural unit, the second polymer is a polymer comprising: a molecular chain comprising the first structural unit and a second structural unit that differs from the first structural unit; and an end structure that bonds to one end of the molecular chain and comprises at least one of an amino group, a hydroxy group and a carboxy group, the third polymer is a block copolymer comprising a block of the first structural unit and a block of the second structural unit, and the first structural unit is derived from a first monomer, and the second structural unit is derived from a second monomer that is more polar than the first monomer.

According to other embodiment of the present invention made for solving the aforementioned problems, a patterned substrate is obtained by the pattern-forming method of the one embodiment of the present invention.

The term "amino group" as referred to herein means a concept involving a primary amino group ($-NH_2$), a secondary amino group ($-NHR$, wherein R represents a monovalent organic group) and a tertiary amino group ($-NRR'$, wherein R and R' each independently represent a monovalent organic group, or R and R' taken together represent a part of an aliphatic heterocyclic structure or an aromatic heterocyclic structure together with the nitrogen atom to which R and R' bond). The secondary amino group may include a group having a nitrogen atom to which one hydrogen atom bonds such as "$-CH_2-NH-$" in a piperidyl group, a morpholyl group, etc., and the like. Further, the tertiary amino group may include a group having a nitrogen atom to which no hydrogen atom bonds such as "$-CH=N-$" in a pyridyl group or a quinolyl group, "$-CH_2-N(-CH_2-)-CH_2-$" in an azabicyclooctyl group, and the like. However, a cyano group does not fall under the category of the tertiary amino group. The term "organic group" as referred to means a group that includes at least one carbon atom.

According to the pattern-forming method of the embodiment of the present invention, a phase separation structure by directed self-assembly is formed, the phase separation structure being superior in orientationality in arrangement, and by using this superior phase separation structure, a patterned substrate having a favorable pattern can be obtained. The patterned substrate of the embodiment of the present invention has a favorable pattern due to being formed through using the phase separation structure by directed self-assembly, the phase separation structure having been formed by the pattern-forming method and being superior in orientationality in arrangement. Therefore, these can be suitably used for lithography processes in manufacture of various types of electronic devices such as semiconductor devices and liquid crystal devices for which further microfabrication is demanded. Hereinafter, embodiments of the present invention will be described in detail.

Pattern-Forming Method

The pattern-forming method includes the silicon-containing film-forming step, the prepattern-forming step, the underlayer film-forming step, the applying step, the phase separation step, the removing step and the etching step. According to the pattern-forming method, the prepattern is formed by using the polymer (P) that is a homopolymer having the structural unit (I) derived from the monomer (I), and the underlayer film includes the polymer (A) including: the molecular chain (I) constituted with the structural unit (I), and the structural unit (II) derived from the monomer (II) having greater polarity than the monomer (I) that are randomly aligned; and the end structure (I) bonding to the molecular chain (I) and including at least any one of an amino group, a hydroxy group and a carboxy group. Additionally, according to the pattern-forming method, a molar ratio of the structural unit (I)/the structural unit (II) in the polymer (A) is no less than the above-specified value, and as the polymer (X) in the composition for directed self-assembled film formation for use, a block copolymer having a block of the structural unit (I) and a block of the structural unit (II) is used.

The pattern-forming method provides superior orientationality in arrangement of the phase separation structure by directed self-assembly, due to: including each of the steps described above; and use of the above-specified polymers as the polymer (P) for forming the prepattern, the polymer (A) for forming the underlayer film, and the polymer (X) for forming the directed self-assembled film. Although not necessarily clarified and without wishing to be bound by any theory, the reason for achieving the effects described above by the pattern-forming method due to the aforementioned constitution is inferred as in the following, for example. It is considered that the orientationality in arrangement of the phase separation structure is more improved since phase separation by directed self-assembly occurs more favorably on a face of: the prepattern that includes the structural unit (I); and the underlayer film that includes the polymer (A) having as the end structure, an amino group, a hydroxy group or a carboxy group bonded to the silicon-containing film, the molar ratio of the structural unit (I)/the structural unit (II) falling within the specified range.

The term "directed self-assembling" or "directed self assembly" as referred to herein means a phenomenon of spontaneously constructing a tissue or a structure without resulting from only the control from an external factor. In the pattern-forming method, a composition for directed self-assembled film formation is applied on a face of a certain prepattern and an underlayer film to form a film having a phase separation structure by directed self-assembly (directed self-assembled film), and a part of phases of the directed self-assembled film is removed to form a microfabricated pattern.

Hereinafter, each step will be described.

Silicon-Containing Film-Forming Step

In this step, a silicon-containing film 102 is formed directly or indirectly on an upper face side of a substrate 101, as shown in FIG. 1.

As the substrate 101, for example, a conventionally well-known substrate such as a silicon wafer or a wafer covered with aluminum may be used.

Forming Procedure of Silicon-Containing Film

The silicon-containing film is formed by applying, for example, a silicon-containing composition for film formation or the like directly or indirectly on an upper face side of a substrate. The silicon-containing composition for film formation is exemplified by a composition containing a polysiloxane and a solvent, or the like. As the silicon-containing composition for film formation, a variety of types of commercially available Spin-on-Glass materials may be used.

The applying procedure of the silicon-containing composition for film formation may include, for example, spin-coating, flow casting-coating, roll coating, and the like.

The coating film formed by the applying of the silicon-containing composition for film formation may be heated. The lower limit of the temperature of the heating is preferably 80° C., more preferably 150° C., and still more preferably 200° C. The upper limit of the temperature is preferably 400° C., more preferably 300° C., and still more preferably 250° C. The lower limit of the time period of the heating is preferably 5 sec, more preferably 30 sec, and still more preferably 50 sec. The upper limit of the time period is preferably 1 hour, more preferably 10 min, and still more preferably 3 min.

The lower limit of the average thickness of the silicon-containing film formed is preferably 10 nm, more preferably 20 nm, and still more preferably 30 nm. The upper limit of the average thickness is preferably 1,000 nm, more preferably 500 nm, and still more preferably 100 nm.

Prepattern-Forming Step

Figure 2:
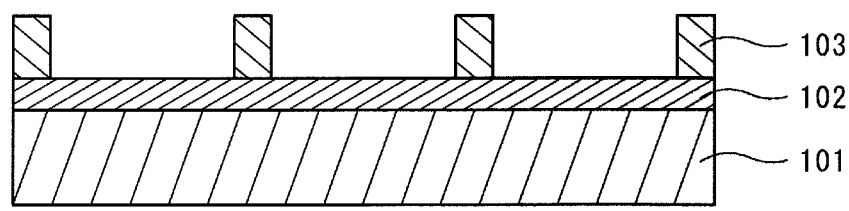
FIG. 2 is a schematic cross sectional view illustrating one example of a state after forming a prepattern on an upper face of the silicon-containing film in the pattern-forming method of the embodiment of the present invention.

In this step, a prepattern 103 is formed on an upper face of the silicon-containing film 102 by using the polymer (P), as shown in FIG. 2. The polymer (P) is as described in the following.

(P) Polymer

The polymer (P) is a homopolymer having the structural unit (I). The polymer (P) may also have other structural unit than the structural unit (I) within a range not leading to impairment of the effects of the present invention. The upper limit of the proportion of the other structural unit included in the polymer (P) with respect to the total structural units constituting the polymer (P) is preferably 5 mol %, more preferably 1 mol %, and still more preferably 0.1 mol %. The polymer (P) may also have a terminal group (hereinafter, may be also referred to as "terminal group (I)") bonded to at least one end of the main chain. The term "main chain" as referred to herein means the longest atom chain in the polymer.

Structural Unit (I)

The structural unit (I) is derived from the monomer (I). The monomer (I) is exemplified by a vinyl aromatic compound, and the like.

Examples of the vinyl aromatic compound include:

styrene;

substituted styrenes such as α-methylstyrene, o-methylstyrene, m-methylstyrene, p-methylstyrene, p-t-butylstyrene, 2,4,6-trimethylstyrene, p-methoxystyrene, p-t-butoxystyrene, 1,2-divinylbenzene, 1,3-divinylbenzene, 1,4-divinylbenzene, o-hydroxystyrene, m-hydroxystyrene, p-hydroxystyrene, m-chloromethylstyrene, p-chloromethylstyrene, p-chlorostyrene, p-bromostyrene, p-iodostyrene, p-nitrostyrene and p-cyano styrene;

substituted or unsubstituted vinyl group-containing aromatic hydrocarbons such as vinylnaphthalene, vinylanthracene, methylvinylnaphthalene and vinylpyrene; and the like.

Of these, the substituted styrenes and unsubstituted styrene are preferred, and unsubstituted styrene is more preferred.

Terminal Group (I)

The terminal group (I) is exemplified by a monovalent group that includes a hetero atom, and the like. When the polymer (P) has as the terminal group (I), the monovalent group that includes a hetero atom, adhesiveness between the prepattern 103 and the silicon-containing film 102 is more enhanced, thereby consequently enabling the orientationality in arrangement of the phase separation structure by directed self-assembly to be more improved. The "hetero atom" as referred to herein means an atom other than a carbon atom or a hydrogen atom. Examples of the hetero atom include an oxygen atom, a nitrogen atom, a sulfur atom, a phosphorus atom, a silicon atom, a tin atom, and the like.

The terminal group (I) is preferably a monovalent organic group that includes a hydroxy group. When the terminal group (I) includes a hydroxy group, the adhesiveness between the prepattern 103 and the silicon-containing film 102 can be more enhanced.

In an exemplary procedure for introducing into the polymer (P), the monovalent group that includes a hetero atom, as the terminal group (I), for example, a polymerizable end of a main chain obtained by polymerization, etc., of the monomer (I) that gives the structural unit (I) is allowed to react by adding a chain-end terminator that includes a hetero atom, and the reaction product is thereafter treated with methanol or the like to produce as the terminal group (I), the monovalent group that includes a hetero atom.

Examples of the chain-end terminator include:

epoxy compounds such as 1,2-butylene oxide, butyl glycidyl ether, propylene oxide, ethylene oxide, 2-ethylhexyl glycidyl ether and 4,4'-methylenebis(N,N-diglycidylaniline);

nitrogen-containing compounds, e.g., isocyanate compounds, thioisocyanate compounds, imidazolidinone, imidazole, aminoketone, pyrrolidone, diethylaminobenzophenone, nitrile compounds, aziridine, formamide, epoxyamine, benzylamine, oxime compounds, azine, hydrazone, imine, aminostyrene, vinylpyridine, aminodiphenylethylene, imide compounds and the like, silane compounds such as alkoxysilane, aminosilane, ketoiminosilane, isocyanatesilane, siloxane, glycidylsilane, mercaptosilane, vinylsilane, epoxysilane, pyridylsilane, piperazylsilane, pyrrolidonesilane, cyanosilane and silane isocyanate:

other compounds such as tin halide, silicon halide, carbon dioxide; and the like.

Of these, the epoxy compounds are preferred, and 1,2-butylene oxide, butyl glycidyl ether, 2-ethylhexyl glycidyl ether or propylene oxide is more preferred.

The lower limit of the polystyrene equivalent number average molecular weight (Mn) of the polymer (P) as determined by gel permeation chromatography (GPC) is preferably 1,000, more preferably 3,000, and still more preferably 5,000. The upper limit of Mn is preferably 50,000, more preferably 20,000, and still more preferably 10,000.

The upper limit of a ratio (Mw/Mn) of the polystyrene equivalent weight average molecular weight (Mw) to Mn of the polymer (P) is preferably 5, more preferably 2, still more preferably 1.5, and particularly preferably 1.3. The lower limit of Mw/Mn is preferably 1.05, and more preferably 1.02.

When Mn and Mw/Mn of the polymer (P) fall within the above range, the orientationality in arrangement of the phase separation structure by directed self-assembly can be more improved.

Mn and Mw herein are values determined by gel permeation chromatography using GPC columns ("G2000HXL"×2; "G3000HXL"×1 and "G4000HXL"×1, available from Tosoh Corporation) under analytical conditions involving: a flow rate of 1.0 mL/min; an elution solvent of tetrahydrofuran; and a column temperature of 40° C., with monodispersed polystyrene as a standard.

Forming Procedure of Prepattern

The prepattern 103 may be formed, for example, as described in the following. First, a composition containing the polymer (P) and the solvent is applied on a face of the silicon-containing film. A coating film thus obtained may be heated. The lower limit of the temperature of the heating is preferably 100° C., more preferably 150° C., and still more preferably 200° C. The upper limit of the temperature of the heating is preferably 350° C., more preferably 300° C., and still more preferably 270° C. The lower limit of the time period of the heating is preferably 10 sec, more preferably 1 min, and still more preferably 2 min. The upper limit of the time period of the heating is preferably 1 hour, more preferably 10 min, and still more preferably 5 min. It is preferred that a film of the polymer (P) formed is rinsed with a solvent to remove an unreacted material. Next, a resist composition is applied on an upper face of the film of the polymer (P) to form a resist film, and the resist film is exposed and thereafter developed to form a resist pattern. Next, etching of the film of the polymer (P) is carried out by oxygen/argon plasma etching or the like using the resist pattern as a mask to form the prepattern 103 including the polymer (P). After the etching, in order to more certainly remove the resist composition used, immersion, etc., in a thinner solution such as RSD-001 may be also carried out.

The shape of the prepattern 103 may be appropriately selected to be in conformity to the pattern intended to be finally formed, and may be, for example, a line-and-space pattern, a hole pattern, a pillar pattern or the like. The lower limit of the average thickness of the prepattern 103 to be formed is preferably 10 nm, more preferably 20 nm, and still more preferably 30 nm. The upper limit of the average thickness is preferably 1,000 nm, more preferably 500 nm, and still more preferably 100 nm.

Underlayer Film-Forming Step

Figure 3:
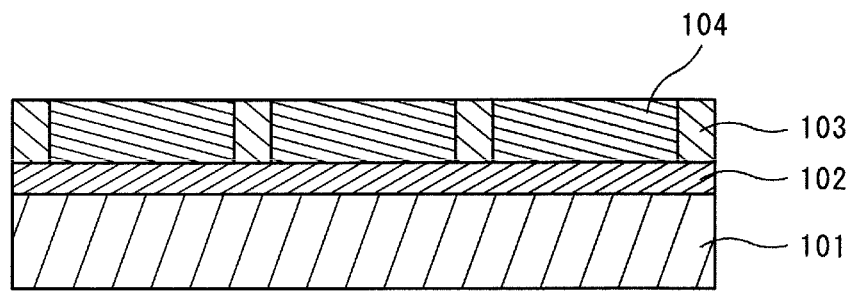
FIG. 3 is a schematic cross sectional view illustrating one example of a state after forming an underlayer film on recessed portions of the prepattern in the pattern-forming method of the embodiment of the present invention.

In this step, an underlayer film 104 that includes the polymer (A) is formed in recessed portions of the prepattern 103 as shown in FIG. 3. The polymer (A) is as described in the following.

(A) Polymer

The polymer (A) has: a molecular chain (I) including the structural unit (I) and the structural unit (II) that are randomly aligned; and the end structure (I) bonding to at least one end of the molecular chain (I) and including at least any one of an amino group, a hydroxy group and a carboxy group. The molecular chain (I) and the end structure (I) are as described in the following.

Molecular Chain (I)

The molecular chain (I) includes the structural unit (I) and the structural unit (II) that are randomly aligned.

Structural Unit (I)

The structural unit (I) is identical to the structural unit (I) in the polymer (P) described above. The monomer (I) that gives the structural unit (I) is exemplified by a similar compound to the monomer (I) used in forming the polymer (P), and the like.

Structural Unit (II))

The structural unit (II) is a structural unit derived from the monomer (II) having greater polarity than the monomer (I).

The monomer (II) is exemplified by (meth)acrylic acid esters, and the like.

Examples of the (meth)acrylic acid ester include:

(meth)acrylic acid alkyl esters such as methyl (meth)acrylate, ethyl (meth)acrylate, t-butyl (meth)acrylate and 2-ethylhexyl (meth)acrylate;

(meth)acrylic acid cycloalkyl esters such as cyclopentyl (meth)acrylate, cyclohexyl (meth)acrylate, 1-methylcyclopentyl (meth)acrylate, 2-ethyladamantyl (meth)acrylate and 2-(adamantan-1-yl)propyl (meth)acrylate;

(meth)acrylic acid substituted alkyl esters such as 2-hydroxyethyl (meth)acrylate, 3-hydroxyadamantyl (meth)acrylate, 3-glycidylpropyl (meth)acrylate and 3-trimethylsilylpropyl (meth)acrylate; and the like.

By using the vinyl aromatic compound as the monomer (I), and the (meth)acrylic acid or the (meth)acrylic acid ester as the monomer (II), the orientationality in arrangement of the phase separation structure by directed self-assembly can be more improved in which, for example, a vinyl aromatic compound-(meth)acrylic acid or (meth)acrylic acid ester block copolymer such as a styrene-methyl methacrylate block copolymer is used as a component for forming the directed self-assembled film.

The lower limit of the molar ratio (structural unit (I)/structural unit (II)) is typically 55/45, preferably 60/40, more preferably 65/35, and still more preferably 70/30. The upper limit of the molar ratio is preferably 80/20, and more preferably 75/25.

End Structure (I)

The end structure (I) includes at least any one of an amino group, a hydroxy group and a carboxy group (—COOH). The end structure (I) may be constituted from the structural unit that includes the group described above in the polymer (A), or the terminal group bonded to one end of the main chain of the polymer (A).

The amino group is exemplified by a primary amino group, a secondary amino group, a tertiary amino group, and the like.

Examples of the secondary amino group include: monosubstituted amino groups such as a methylamino group, an ethylamino group, a cyclohexylamino group and a phenylamino group; —NH—R— (wherein, R represents a divalent organic group); and the like.

Examples of the tertiary amino group include: disubstituted amino groups such as a dimethylamino group, a diethylamino group, a dicyclohexylamino group and a diphenylamino group; trivalentamino groups such as —N=R— (wherein, R represents a trivalentorganic group) and —CH$_2$—N(—CH$_2$—)—CH$_2$—; and the like.

Furthermore, the amino group is also exemplified by a group derived from an amine having the aliphatic heterocyclic structure or aromatic heterocyclic structure described above.

Of these, in light of an improvement of the orientationality in arrangement of the phase separation structure by directed self-assembly, the tertiary amino group, or the group derived from an amine having the aliphatic heterocyclic structure or aromatic heterocyclic structure is preferred, the tertiary amino group is more preferred, the dialkylamino group is still more preferred, and the dimethylamino group is particularly preferred.

The hydroxy group may involve both an alcoholic hydroxy group and a phenolic hydroxy group. Of these, the alcoholic hydroxy group is preferred.

The end structure (I) is represented by, for example, the following formula (1) or the following formula (2). Hereinafter, the end structure (I) represented by the formula (1) may be also referred to as "end structure (I-1)", and the end structure (I) represented by the formula (2) may be also referred to as "end structure (I-2)". In the case of the end structure (I-1), the structural unit includes at least one selected from an amino group, a hydroxy group and a carboxy group, whereas in the case of the end structure (I-2), the terminal group includes an amino group, a hydroxy group and/or carboxy group.

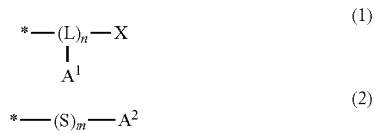

In the above formula (1), L represents a trivalent group having 1 to 20 carbon atoms; $A^1$ represents a monovalent group which includes an amino group, a hydroxy group or a carboxy group; X represents a hydrogen atom, a monovalent organic group having 1 to 20 carbon atoms, —SH or —S-$A^{11}$, wherein $A^{11}$ represents a monovalent group which includes an amino group, a hydroxy group or a carboxy group; n is an integer of no less than 2, and indicates the number of structural units constituting a block represented by $(-L(-A^1)-)_n$; and * denotes a site bonding to the end of the molecular chain (I).

In the above formula (2), $A^2$ represents a monovalent group which includes an amino group, a hydroxy group or a carboxy group; m is 0 or 1; and * denotes a site bonding to the end of the molecular chain (I).

End Structure (I-1)

The end structure (I-1) is represented by the above formula (1).

The lower limit of n indicating the number of structural units represented by $(-L(-A^1)-)$ in the end structure (I-1) is typically 2, and preferably 3. The upper limit of n is preferably 20, and more preferably 10. When the value of n falls within the above range, the orientationality in arrangement of the phase separation structure by directed self-assembly can be more improved.

The trivalent group having 1 to 20 carbon atoms represented by L constitutes the main chain of the polymer (A), and preferred examples of the trivalent groups represented by the following partial structure (the following formula (A')) in the formula (A) described later, e.g., alkanetriyl groups such as an ethanetriyl group, alkanediyl-carbonyloxy groups such as a propanediyl-carbonyloxy group, and the like.

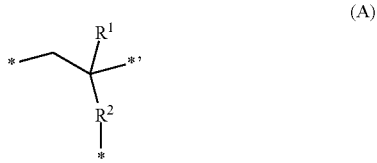

In the above formula (A'), $R^1$ represents a hydrogen atom, a fluorine atom or a monovalent organic group having 1 to 20 carbon atoms; $R^2$ represents a single bond, —O— or —COO—; and * denotes a bonding site.

The monovalent organic group having 1 to 20 carbon atoms represented by X is exemplified by: (1) a monovalent hydrocarbon group having 1 to 20 carbon atoms; (2) a group having 1 to 20 carbon atoms that includes a divalent hetero atom-containing group between two adjacent carbon atoms of a hydrocarbon group; (3) a group having 1 to 20 carbon atoms obtained by substituting with a monovalent hetero atom-containing group, a part or all of hydrogen atoms included in the aforementioned group (1) or in the aforementioned group (2); and the like.

Exemplary monovalent hydrocarbon group having 1 to 20 carbon atoms includes a monovalent chain hydrocarbon group having 1 to 20 carbon atoms, a monovalent alicyclic hydrocarbon group having 3 to 20 carbon atoms, a monovalent aromatic hydrocarbon group having 6 to 20 carbon atoms, and the like.

The "hydrocarbon group" may involve a chain hydrocarbon group, an alicyclic hydrocarbon group and an aromatic hydrocarbon group. The "hydrocarbon group" is a saturated hydrocarbon group or an unsaturated hydrocarbon group. The "chain hydrocarbon group" as referred to herein means a hydrocarbon group not having a ring structure but being constituted only from a chain structure, and involves both a linear hydrocarbon group and a branched hydrocarbon group. The "alicyclic hydrocarbon group" as referred to herein means a hydrocarbon group having as a ring structure, not an aromatic ring structure but only an alicyclic structure, and involves both a monocyclic alicyclic hydrocarbon group and a polycyclic alicyclic hydrocarbon group. It is not necessary that the alicyclic hydrocarbon group is constituted from only the alicyclic structure, and a part thereof may also include a chain structure. The "aromatic hydrocarbon group" as referred to herein means a hydrocarbon group that includes an aromatic ring structure as the ring structure. It is not necessary that the aromatic hydrocarbon group is constituted from only the aromatic ring structure, and a part thereof may also include a chain structure and/or an alicyclic structure.

Examples of the monovalent chain hydrocarbon group having 1 to 20 carbon atoms include:

alkyl groups such as a methyl group, an ethyl group, a n-propyl group, an i-propyl group, a n-butyl group, an i-butyl group, a t-butyl group, a pentyl group, a hexyl group, an octyl group, a decyl group and a dodecyl group;

alkenyl groups such as an ethenyl group, a propenyl group and a butenyl group;

alkynyl groups such as an ethynyl group, a propynyl group and a butynyl group; and the like.

Examples of the monovalent alicyclic hydrocarbon group having 3 to 20 carbon atoms include:

monocyclic alicyclic saturated hydrocarbon groups such as a cyclopentyl group and a cyclohexyl group;

monocyclic alicyclic unsaturated hydrocarbon groups such as a cyclopentenyl group and a cyclohexenyl group;

polycyclic alicyclic saturated hydrocarbon groups such as a norbornyl group, an adamantyl group and a tricyclodecyl group;

polycyclic alicyclic unsaturated hydrocarbon groups such as a norbornenyl group and a tricyclodecenyl group; and the like.

Examples of the monovalent aromatic hydrocarbon group having 6 to 20 carbon atoms include:

aryl groups such as a phenyl group, a tolyl group, a xylyl group, a naphthyl group and an anthryl group;

aralkyl groups such as a benzyl group, a phenethyl group, a naphthylmethyl group and an anthrylmethyl group; and the like.

The hetero atom that may constitute the monovalent or divalent hetero atom-containing group is exemplified by an oxygen atom, a nitrogen atom, a sulfur atom, a phosphorus atom, a silicon atom, a halogen atom and the like. Examples of the halogen atom include a fluorine atom, a chlorine atom, a bromine atom, an iodine atom and the like.

Examples of the divalent hetero atom-containing group include —O—, —CO—, —S—, —CS—, —NR'—, groups obtained by combining at least two of the same, and the like, wherein R' represents a hydrogen atom or a monovalent hydrocarbon group.

Examples of the monovalent hetero atom-containing group include a halogen atom, a hydroxy group, a carboxy group, a cyano group, an amino group, a sulfanyl group, and the like.

The organic group which may be represented by X is preferably a benzyl group, a dodecyl group or a t-butyl group.

In the above formula (1), X represents preferably a hydrogen atom.

The end structure (I-1) has, as the structural unit represented by (-L(-A$^1$)-) in the above formula (1), for example, a third structural unit (hereinafter, may be also referred to as "structural unit (III)") represented by the following formula (A).

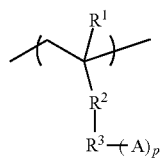

(A)

In the above formula (A), $R^1$ represents a hydrogen atom, a fluorine atom or a monovalent organic group having 1 to 20 carbon atoms; $R^2$ represents a single bond, —O— or —COO—; p is an integer of 1 to 3, wherein in a case in which p is 1, $R^3$ represents a single bond, or a substituted or unsubstituted divalent hydrocarbon group having 1 to 20 carbon atoms, and in a case in which p is no less than 2, $R^3$ represents a substituted or unsubstituted hydrocarbon group having 1 to 20 carbon atoms and having a valency of (1+p); and A represents an amino group, a hydroxy group or a carboxy group, wherein in a case in which p is no less than 2, a plurality of As may be identical or different.

Examples of the monovalent organic group having 1 to 20 carbon atoms which may be represented by $R^1$ include groups similar to the monovalent organic group having 1 to 20 carbon atoms exemplified for X in the above formula (1), and the like, and specific examples thereof include: alkyl groups such as a methyl group, an ethyl group, an i-propyl group, a n-butyl group, an i-butyl group, a t-butyl group and a n-octyl group; monocyclic alicyclic saturated hydrocarbon groups such as a cyclohexyl group; fluoroalkyl groups such as a trifluoromethyl group and a pentafluoroethyl group; hydroxyalkyl groups such as a hydroxymethyl group and a hydroxyethyl group; and the like.

$R^1$ represents preferably a hydrogen atom or a methyl group, in light of the degree of copolymerization of the monomer that gives the structural unit (III).

$R^2$ represents preferably a single bond or —COO—.

Examples of the substituted or unsubstituted hydrocarbon group having 1 to 20 carbon atoms and having a valency of (1+p), which is represented by $R^3$ in the case in which p is no less than 2, include groups obtained by removing "p" hydrogen atoms from: the monovalent hydrocarbon group having 1 to 20 carbon atoms; the group that includes a divalent hetero atom-containing group between two adjacent carbon atoms of the monovalent hydrocarbon group having 1 to 20 carbon atoms, and the group obtained by substituting with a monovalent hetero atom-containing group, a part or all of hydrogen atoms included in the monovalent hydrocarbon group having 1 to 20 carbon atoms or the group that includes a divalent hetero atom-containing group, each being exemplified for X in the above formula (1). It is to be noted that in a case in which A represents an amino group, $R^3$ and one or a plurality of As may taken together represent a group derived from an amine having an aliphatic heterocyclic structure or an aromatic heterocyclic structure.

The substituted or unsubstituted divalent hydrocarbon group having 1 to 20 carbon atoms represented by $R^3$ in a case in which p is 1 is exemplified by the substituted or unsubstituted hydrocarbon group having 1 to 20 carbon atoms and having a valency of (1+p), described above, wherein p is 1, and the like.

Specific examples of —$R^3$-(A)$_p$ in a case in which A represents an amino group include a group represented by the following formula (a), and the like.

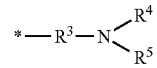

(a)

In the above formula (a), $R^3$ is identical to the group represented by $R^3$ in the above formula (A), $R^4$ and $R^5$ each independently represent a hydrogen atom, a monovalent hydrocarbon group having 1 to 20 carbon atoms or a group that includes at least one group selected from —O—, —CO— and —NH—, between two adjacent carbon atoms of the monovalent hydrocarbon group having 1 to 20 carbon atoms, or at least two of $R^3$, $R^4$ and $R^5$ taken together represent a part of an aliphatic heterocyclic structure having 3 to 20 ring atoms or an aromatic heterocyclic structure having 5 to 20 ring atoms together with the nitrogen atom to which the at least two of $R^3$, $R^4$ and $R^5$ bond.

Examples of the monovalent hydrocarbon group having 1 to 20 carbon atoms which may be represented by $R^4$ or $R^5$ include groups similar to the monovalent hydrocarbon group having 1 to 20 carbon atoms exemplified for X in the above formula (1), and the like.

Examples of the group that includes at least one group selected from —O—, —CO— and —NH— between two adjacent carbon atoms of the hydrocarbon group which may be represented by $R^4$ or $R^5$ include a methoxymethyl group, a methylcarbonylmethyl group, a methylaminomethyl group, and the like.

Examples of the aliphatic heterocyclic structure having 3 to 20 ring atoms which may be represented by at least two of $R^3$, $R^4$ and $R^5$ taken together include an azacyclopentane structure, an azacyclohexane structure, an azanorbornane structure, and the like.

Examples of the aromatic heterocyclic structure having 5 to 20 ring atoms which may be represented by at least two of $R^3$, $R^4$ and $R^5$ taken together include a pyrrole structure, a pyridine structure, a quinoline structure, a pyrimidine structure, a pyrazine structure, an imidazole structure, and the like.

Specific examples of the structural unit (III) include structural units (hereinafter, may be also referred to as "structural units (III-1) to (III-21)") represented by the following formulae (A-1) to (A-21), and the like.
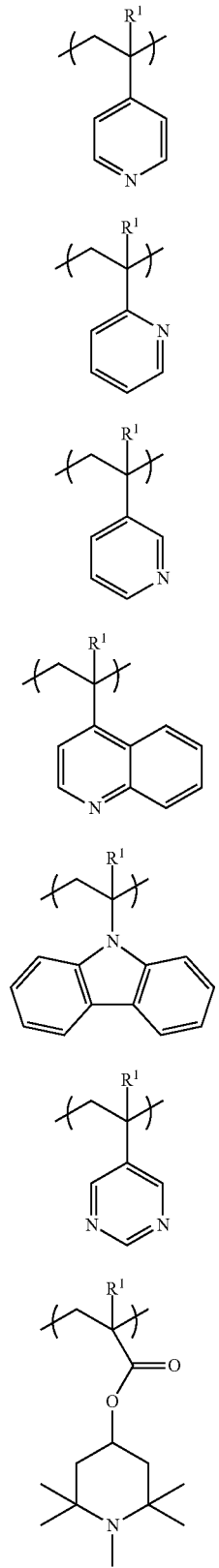
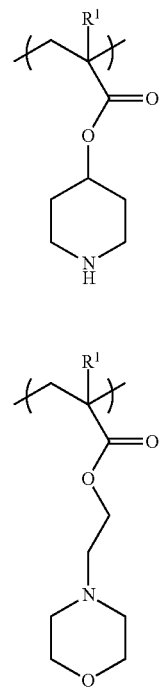
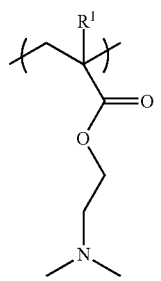
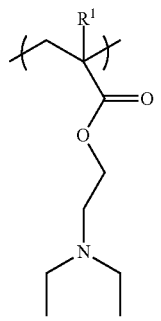
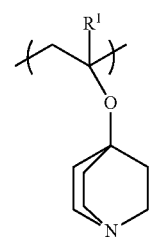

(A-13) 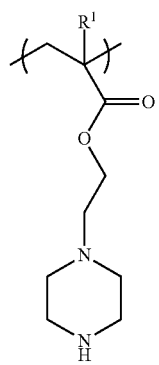

(A-14) 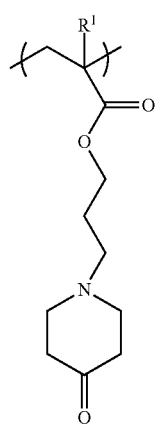

(A-15) 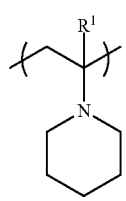

(A-16) 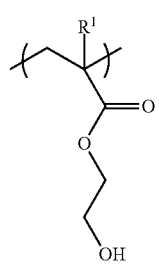

(A-17) 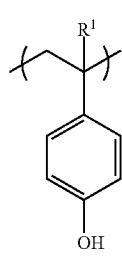

(A-18) 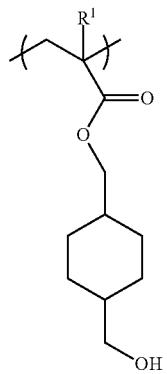

(A-19) 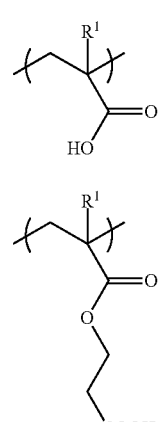

(A-20) 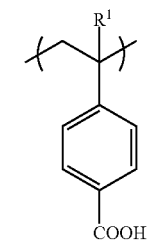

(A-21) 

In the above formulae (A-1) to (A-21), $R^1$ is as defined in the above formula (A).

Of these, the structural unit (III-10), (III-16) or (III-19) is preferred.

The lower limit of the proportion of the structural unit (III) contained with respect to the total structural units constituting the polymer (A) is preferably 0.1 mol %, more preferably 0.5 mol %, still more preferably 1 mol %, and particularly preferably 2 mol %. The upper limit of the proportion of the structural unit (III) is preferably 30 mol %, more preferably 20 mol %, still more preferably 10 mol %, and particularly preferably 7 mol %.

End Structure (1-2)

The end structure (1-2) is represented by the above formula (2). $A^2$ in the above formula (2) is preferably the group represented by —$R^3$-$(A)_p$ in the above formula (A).

Specific examples of the end structure (1-2) include groups represented by the following formulae (2-1) to (2-9), and the like.

(2-1)

*~S~~~N(CH3)~

(2-2)

*~S~~~NH₂

(2-3)

*~S~~NH₂

(2-4)

*~S~NH₂

(2-5)

*~S~~(pyridine)

(2-6)

*~S~~~OH (2-7)

*~S~~~COOH (2-8)

*~S~~~~COOH (2-9)

*~S~~~~OH

In the above formulae (2-1) to (2-9), * is as defined in the above formula (2).

The lower limit of Mn of the polymer (A) is preferably 1,000, more preferably 3,000, and still more preferably 5,000. The upper limit of Mn is preferably 50,000, more preferably 20,000, and still more preferably 10,000.

The upper limit of a ratio (Mw/Mn) of a polystyrene equivalent weight average molecular weight (Mw) to Mn of the polymer (A) is preferably 5, more preferably 2, still more preferably 1.5, and particularly preferably 1.3. The lower limit of Mw/Mn is preferably 1.05 and more preferably 1.02.

When Mn and Mw/Mn of the polymer (A) fall within the above ranges, the orientationality in arrangement of the phase separation structure by directed self-assembly can be more improved.

Synthesis Procedure of Polymer (A)

The polymer (A) having the end structure (I-1) may be synthesized by, for example: polymerizing the monomer (I) such as styrene and the monomer (II) such as methyl methacrylate by anionic polymerization or controlled radical polymerization in an appropriate solvent through using a RAFT agent such as a trithiocarbonate compound (e.g., 2-cyano-2-propyldodecyl trithiocarbonate, etc.), and an anionic polymerization initiator such as sec-BuLi or a radical polymerization initiator such as azobisisobutyronitrile (AIBN); and thereafter further allowing for polymerization through further adding a monomer that gives the end structure (I-1) such as N,N-dimethylaminoethyl methacrylate, 2-hydroxyethyl methacrylate or methacrylic acid.

The polymer (A) having the end structure (I-2) may be synthesized, for example as shown in connection with the synthesis of the polymer (A) having the end structure (I-1), by: polymerizing through mixing the monomer (I) and the monomer (II) as well as a RAFT agent such as a trithiocarbonate compound; and thereafter allowing amine degradation of a trithiocarbonate end of a polymer thus obtained by using a primary or secondary amine; producing an —SH group that bonds to an end of the molecular chain (I); and thereafter allowing a click reaction of the —SH group with an amine compound, a hydroxy compound or a carboxylic acid having a double bond or a triple bond, thereby enabling conversion into a monovalent group having an amino group, a hydroxy group or a carboxy group that bonds to —S— of the end of the molecular chain (I). Alternatively, by allowing an SN2 reaction of a halogenated alkane having an amino group, a hydroxy group or a carboxy group with a trithiocarbonate end having been subjected to amine-degradation in the presence of a base, thereby also enabling conversion into a monovalent group having an amino group, a hydroxy group or a carboxy group that bonds to —S— of the end of the molecular chain (I).

Composition for Underlayer Film Formation

The underlayer film 104 may be formed by, for example, filling the recessed portions of the prepattern 103 with a composition for underlayer film formation (hereinafter, may be also referred to as "composition for underlayer film formation (I)") containing the polymer (A) and the solvent (hereinafter, may be also referred to as "(B) solvent" or "solvent (B)"). The composition for underlayer film formation (I) may contain other component than the polymer (A) and the solvent (B), within a range not leading to impairment of the effects of the present invention.

(B) Solvent

The solvent (B) is not particularly limited as long as it is capable of dissolving or dispersing at least the polymer (A), and other component(s) that may be contained as needed.

The solvent (B) is exemplified by an alcohol solvent, an ether solvent, a ketone solvent, an amide solvent, an ester solvent, a hydrocarbon solvent, and the like. These solvents (B) may be used in combination of two or more types thereof.

Examples of the alcohol solvent include:
aliphatic monohydric alcohol solvents having 1 to 18 carbon atoms such as 4-methyl-2-pentanol and n-hexanol;
alicyclic monohydric alcohol solvents having 3 to 18 carbon atoms such as cyclohexanol;
polyhydric alcohol solvents having 2 to 18 carbon atoms such as 1,2-propylene glycol;
polyhydric alcohol partial ether solvents having 3 to 19 carbon atoms such as propylene glycol monomethyl ether; and the like.

Examples of the ether solvent include:
dialkyl ether solvents such as diethyl ether, dipropyl ether, dibutyl ether, dipentyl ether, diisoamyl ether, dihexyl ether and diheptyl ether;
cyclic ether solvents such as tetrahydrofuran and tetrahydropyran;
aromatic ring-containing ether solvents such as diphenyl ether and anisole; and the like.

Examples of the ketone solvent include:
chain ketone solvents such as acetone, methyl ethyl ketone, methyl n-propyl ketone, methyl n-butyl ketone, diethyl ketone, methyl iso-butyl ketone, 2-heptanone, ethyl n-butyl ketone, methyl n-hexyl ketone, di-iso-butyl ketone and trimethylnonanone;
cyclic ketone solvents such as cyclopentanone, cyclohexanone, cycloheptanone, cyclooctanone and methylcyclohexanone;
2,4-pentanedione, acetonylacetone and acetophenone; and the like.

Examples of the amide solvent include:
cyclic amide solvents such as N,N'-dimethylimidazolidinone and N-methylpyrrolidone;
chain amide solvents such as N-methylformamide, N,N-dimethylformamide, N,N-diethylformamide, acetamide, N-methylacetamide, N,N-dimethylacetamide and N-methylpropionamide; and the like.

Examples of the ester solvent include:

acetic acid ester solvents such as n-butyl acetate;

monocarboxylic acid ester solvents, e.g., lactic acid ester solvents such as ethyl lactate and butyl lactate;

polyhydric alcohol carboxylate solvents such as propylene glycol acetate;

polyhydric alcohol partial ether carboxylate solvents such as propylene glycol monomethyl ether acetate;

polyhydric carboxylic acid diester solvents such as diethyl oxalate;

carbonate solvents such as dimethyl carbonate, diethyl carbonate, ethylene carbonate and propylene carbonate; and the like.

Examples of the hydrocarbon solvent include:

aliphatic hydrocarbon solvents having 5 to 12 carbon atoms such as n-pentane and n-hexane;

aromatic hydrocarbon solvents having 6 to 16 carbon atoms such as toluene and xylene; and the like.

Of these, the ester solvents are preferred, the polyhydric alcohol partial ether carboxylate solvents and/or the lactic acid ester solvents are more preferred, and propylene glycol monomethyl ether acetate and/or ethyl lactate are/is still more preferred. When the aforementioned solvent is used as the solvent (B), the orientationality in arrangement of the phase separation structure by directed self-assembly can be more improved.

Other Component

The other component is exemplified by a surfactant, a crosslinking agent, and the like. The surfactant is a component that enables coating characteristics of the composition for underlayer film formation (I) to be improved. When the composition for underlayer film formation (I) contains the crosslinking agent, a crosslinking reaction of the polymer (A) with the crosslinking agent occurs, whereby heat resistance of the underlayer film to be formed can be improved.

Preparation Procedure of Composition for Underlayer Film Formation

The composition for underlayer film formation (I) may be prepared by mixing, for example, the polymer (A), the solvent (B) and as needed other component(s) at a certain ratio, and preferably filtering, a mixture thus obtained through, for example, a filter having a fine pore of about 0.45 μm, or the like. The lower limit of the solid content concentration of the composition for underlayer film formation (I) is preferably 0.1% by mass, more preferably 0.5% by mass, still more preferably 0.8% by mass, and particularly preferably 1% by mass. The upper limit of the solid content concentration is preferably 50% by mass, more preferably 30% by mass, still more preferably 10% by mass, and particularly preferably 5% by mass.

Forming Procedure of Underlayer Film

The underlayer film 104 may be formed by: applying the composition for underlayer film formation (I) with a well-known method such as spin coating to form a coating film in the recessed portions of the prepattern 103; and hardening the coating film by heating and/or exposure. Examples of the radioactive ray used for the exposure include visible light rays, ultraviolet rays, far ultraviolet rays, X-rays, electron beams, γ-rays, molecular beams, ion beams, and the like. The lower limit of the temperature of the heating is preferably 100° C., more preferably 120° C., still more preferably 150° C., and particularly preferably 180° C. The upper limit of the temperature is preferably 400° C., more preferably 300° C., still more preferably 240° C., and particularly preferably 220° C. The lower limit of the time period of the heating is preferably 10 sec, more preferably 30 sec, and still more preferably 1 min. The upper limit of the heating time period is preferably 30 min, more preferably 10 min, and still more preferably 5 min. The atmosphere in which the heating of the coating film is conducted may be either an air atmosphere or an atmosphere of inert gas such as nitrogen gas.

The lower limit of the average thickness of the underlayer film 104 is preferably 10 nm, more preferably 20 nm, and still more preferably 30 nm. The upper limit of the average thickness is preferably 1,000 nm, more preferably 500 nm, and still more preferably 100 nm.

The face of the underlayer film 104 and the face of the prepattern 103 are preferably provided to give an approximately identical plane. In other words, it is preferred that the average thickness of the underlayer film 104 is approximately the same as the average thickness of the prepattern 103. Accordingly, the orientationality in arrangement of the phase separation structure by directed self-assembly can be more improved. The directed self-assembled film is overlaid on the faces of the underlayer film 104 and the prepattern 103.

Applying Step

In this step, a composition for directed self-assembled film formation (hereinafter, may be also referred to as "composition for directed self-assembled film formation (I)") containing the polymer (X) is applied on an upper face of the underlayer film 104.

Composition for directed self-assembled film formation

The composition for directed self-assembled film formation (I) contains the polymer (X). The composition for directed self-assembled film formation usually contains a solvent (hereinafter, may be also referred to as "(S) solvent" or "solvent (S)"), and may contain other component(s) than the polymer (X) and the solvent (S) within a range not leading to impairment of the effects of the present invention.

(X) Polymer

The polymer (X) is a block copolymer having a block of the structural unit (I) and a block of the structural unit (II).

The structural unit (I) and the structural unit (II) are identical to the structural unit (I) and the structural unit (II) included in the molecular chain (I) of the polymer (A). Accordingly, the polymer (X) is a block copolymer having a block formed from the monomer (I), and a block formed from the monomer (II).

The polymer (X) is preferably a block copolymer having a block formed from a vinyl aromatic compound, and a block formed from (meth)acrylic acid or a (meth)acrylic acid ester, and more preferably a styrene-methyl methacrylate block copolymer.

The lower limit of Mn of the polymer (X) is preferably 1,000, more preferably 5,000, and still more preferably 10,000. The upper limit of Mn is preferably 300,000, more preferably 200,000, and still more preferably 100,000.

The upper limit of Mw/Mn of the polymer (X) is preferably 5, more preferably 2, still more preferably 1.5, particularly preferably 1.3, and further particularly preferably 1.1. The lower limit of Mw/Mn is preferably 1.05 and more preferably 1.02.

When Mn and Mw/Mn of the polymer (X) fall within the above range, the orientationality in arrangement of the phase separation structure by directed self-assembly can be more improved.

(S) Solvent

The solvent (S) is not particularly limited as long as it is capable of dissolving or dispersing the polymer (X), as well as other component(s) which may be contained as needed.

Examples of the solvent (S) include solvents similar to those exemplified for the solvent (B) in connection with the composition for underlayer film formation (I).

Other Component

The other component is exemplified by a surfactant and the like.

Forming Procedure of Coating Film

Figure 4:
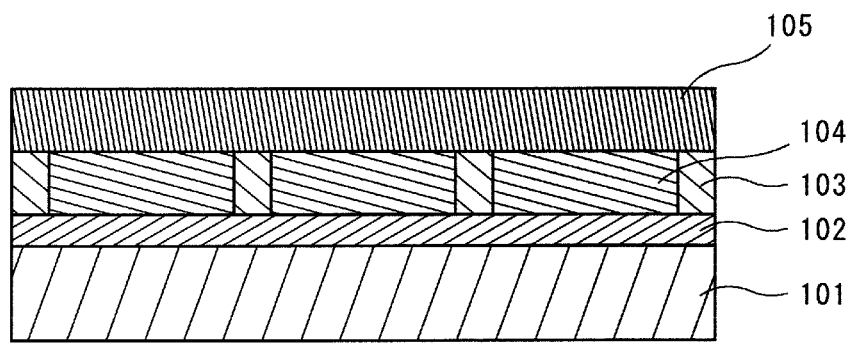
FIG. 4 is a schematic cross sectional view illustrating one example of a state after forming a coating film of a composition for directed self-assembled film formation, on one face of the underlayer film in the pattern-forming method of the embodiment of the present invention.

The applying procedure of the composition for directed self-assembled film formation (I) is exemplified by spin coating, and the like. As shown in FIG. 4, the composition for directed self-assembled film formation (I) is applied on the faces of the prepattern 103 and the underlayer film 104 to form the coating film 105.

Phase Separation Step

Figure 5:
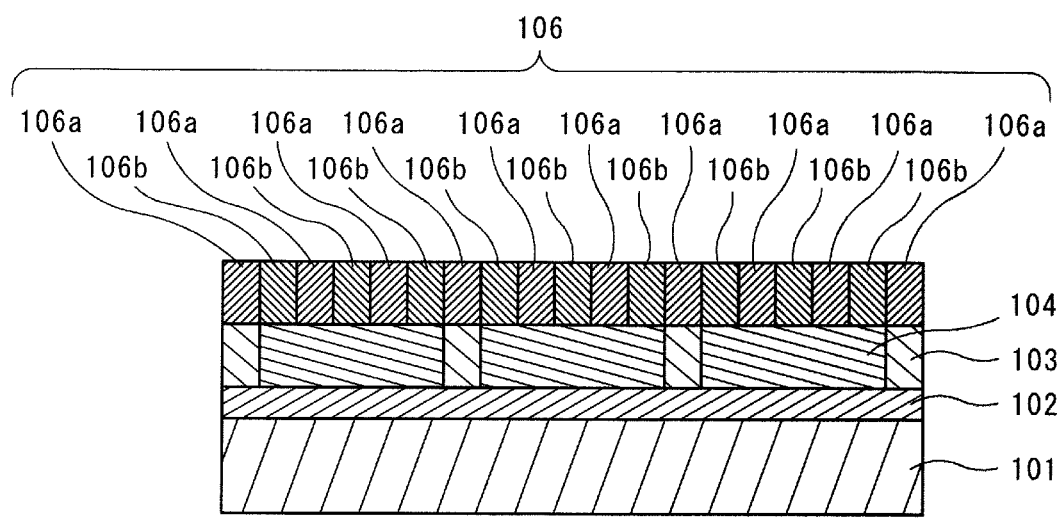
FIG. 5 is a schematic cross sectional view illustrating one example of a state after forming a directed self-assembled film by allowing phase separation of the coating film in the pattern-forming method of the embodiment of the present invention.

In this step, phase separation of the coating film 105 formed by the applying step is allowed. Accordingly, the directed self-assembled film 106 is formed as shown in FIG. 5.

In the phase separation of the coating film 105, annealing or the like may be carried out, whereby portions having identical properties are assembled with one another to spontaneously form an ordered pattern, and thus directed self-assembly, as generally referred to, can be accelerated.

The annealing process may include, for example, heating in an oven, on a hot plate, etc., and the like. The lower limit of the temperature of the heating is preferably 80° C., more preferably 150° C., and still more preferably 200° C. The upper limit of the temperature is preferably 400° C., more preferably 350° C., and still more preferably 300° C. The lower limit of the time period of the heating is preferably 10 sec, more preferably 1 min, and still more preferably 3 min. The upper limit of the time period is preferably 120 min, more preferably 60 min, and still more preferably 10 min. The annealing may be carried out in the air, or in an inert gas atmosphere such as nitrogen. When the annealing is carried out in an inert gas atmosphere, pattern size is likely to be stabilized, and defects in phase separation can be reduced.

The lower limit of the average thickness of the directed self-assembled film 106 to be formed is preferably 1 nm, more preferably 5 nm, and still more preferably 10 nm. The upper limit of the average thickness is preferably 500 nm, more preferably 100 nm, and still more preferably 50 nm.

As shown in FIG. 5, a phase separation structure is formed on faces of the underlayer film 104 and of the prepattern 103. In a case of the prepattern 103 being a line-and-space pattern, in general, phases 106a of blocks of the structural units (I) having a higher affinity to the prepattern 103 are formed on the face of the prepattern 103, whereas on the face of the underlayer film 104, a lamellae phase separation structure is formed in which phases 106a of the blocks of the structural units (I) and phases 106b of the blocks of the structural units (II) are alternately arranged. In a case of the prepattern 103 being a pattern having hole shapes, in general, phases of blocks of the structural units (I) having a higher affinity to the prepattern 103 are formed on the face of the prepattern, whereas on the face of the underlayer film 104, a concentric phase separation structure is formed in which phases of the blocks of the structural units (I) and phases of the blocks of the structural units (II) are alternately arranged.

Removing Step

In this step, at least a part of phases of the directed self-assembled film formed by the phase separation step is removed. Thus, a microfabricated pattern is formed.

Figure 6:
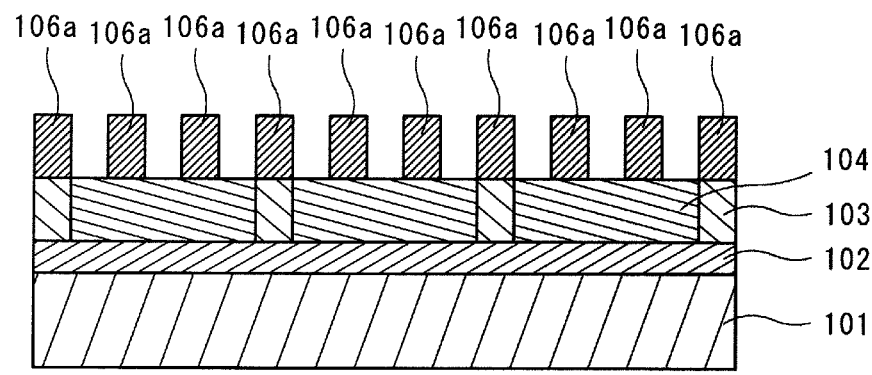
FIG. 6 is a schematic cross sectional view illustrating one example of a state after removing a part of phases of directed self-assembled film in the pattern-forming method of the embodiment of the present invention.

One of the phases 106a and 106b can be removed by an etching treatment, by way of the difference in etching rates, etc., of the phases provided after the phase separation through the directed self-assembling. A state after removing the phases 106b being a part of the phase separation structure is shown in FIG. 6.

A procedure for removing one of the phases 106a and 106b in the phase separation structure involved in the directed self-assembled film 106 is exemplified by known techniques including: reactive ion etching (RIE) such as chemical dry etching and chemical wet etching; physical etching such as sputtering etching and ion beam etching; and the like. Of these, the reactive ion-etching (RIE) is preferred, and the chemical dry etching carried out by using $CF_4$, $O_2$ gas or the like and the chemical wet etching carried out by using an etching liquid, e.g., an organic solvent such as methyl isobutyl ketone (MIBK) or 2-propanol (IPA), or hydrofluoric acid are more preferred.

Etching Step

In this step, the substrate 101 is etched by using the microfabricated pattern formed by the removing step. Thus, a patterned substrate is obtained.

As the mask, the microfabricated pattern constituted of the phases 106a being a part of the directed self-assembled film remained in the removing step shown in FIG. 6 was used to carry out etching once or several times sequentially, thereby enabling the substrate to be patterned through etching of the substrate 101. After completion of the patterning on the substrate, the phases, etc., used as the mask are removed from the substrate by a dissolving treatment or the like, whereby a substrate pattern (patterned substrate) can be finally obtained. The pattern thus obtained is, for example, a line-and-space pattern, a hole pattern, a pillar pattern, and the like. As the procedure for the etching, a procedure similar to those for the etching exemplified in connection with the removing step may be employed. Of these, the dry etching is preferred. The gas for use in the dry etching may be appropriately selected in accordance with the materials of the substrate. For example, in the case of the substrate of a silicon material, a gas mixture of chlorofluorocarbon-containing gas and $SF_4$, or the like may be used. Alternatively, a gas mixture of $BCl_3$ and $Cl_2$, or the like may be used in the case of the substrate being a metal film.

The patterned substrate obtained by the pattern-forming method is suitably used for semiconductor elements and the like, and further the semiconductor elements are widely used for LED, solar cells, and the like.

EXAMPLES

Hereinafter, the present invention is explained in detail by way of Examples, but the present invention is not in any way limited to these Examples. Unless otherwise specified particularly, each compound used in the following Examples was a reagent being commercially available. Measuring methods for various types of physical properties are shown below.

Weight Average Molecular Weight (Mw) and Number Average Molecular Weight (Mn)

Mw and Mn were determined by gel permeation chromatography (GPC) using GPC columns (Tosoh Corporation, "G2000HXL"×2, "G3000HXL"×1 and "G4000HXL"×1), under analytical conditions involving a flow rate of 1.0 mL/min and elution solvent of tetrahydrofuran, and a column temperature of 40° C., with mono-dispersed polystyrene as a standard.

$^{13}$C-NMR Analysis

A $^{13}$C-NMR analysis was performed by using "JNM-EX400" available from JEOL, Ltd., with DMSO-$d_6$ as a solvent for the measurement. The proportion of each structural unit contained was calculated from a peak area ratio corresponding to each structural unit in a spectrum obtained by the $^{13}$C-NMR analysis.

Synthesis of Polymer (A)

Synthesis Example 1

Into a 200-mL three-neck flask, 0.69 g of 2-cyano-2-propyldodecyl trithiocarbonate, 0.098 g of azobisisobutyronitrile (AIBN), 17.5 g of styrene, 6.00 g of methyl methacrylate and 40 g of anisole were added, and the mixture was stirred under nitrogen with heating at 80° C. for 5 hrs. Next, 2.01 mL of N,N-dimethylaminoethyl methacrylate was added with a syringe and 0.098 g of AIBN was further added thereto, and the mixture was stirred under nitrogen with heating at 80° C. for 3 hrs.

The polymerization reaction mixture thus obtained was charged into 500 g of methanol to permit purification by precipitation, and thus resulting precipitate was dissolved in 20 g of propylene glycol monomethyl ether acetate (PGMEA), to which 0.49 g of AIBN, 2.03 g of tert-dodecanethiol and 1 g of propylene glycol monomethyl ether (PGME) were added, and the mixture was stirred under nitrogen with heating at 90° C. for 2 hrs.

A reaction mixture thus obtained was concentrated, followed by diluting with 10 g of tetrahydrofuran (THF) and then purification by precipitation was permitted through charging into 500 g of methanol. A resulting pale yellow solid was dried under reduced pressure to give 18.6 g of a polymer represented by the following formula (A-1). The polymer (A-1) had Mn of 6,060, Mw of 7,300 and Mw/Mn of 1.20. As a result of the $^{13}$C-NMR analysis, the proportion of each structural unit contained in the polymer (A-1) was as presented in the following formula (A-1), and a molar ratio of the styrene-derived unit (first structural unit) to the methyl methacrylate-derived unit (second structural unit) was 73.7:26.3.

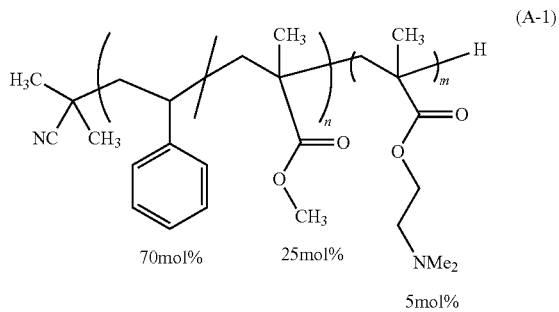

Synthesis Example 2

Into a 200-mL three-neck flask, 0.69 g of 2-cyano-2-propyldodecyl trithiocarbonate, 0.098 g of AIBN, 17.5 g of styrene, 6.00 g of methyl methacrylate and 40 g of anisole were added, and the mixture was stirred under nitrogen with heating at 80° C. for 5 hrs. Next, 1.02 mL of methacrylic acid was added with a syringe and 0.098 g of AIBN was further added thereto, and the mixture was stirred under nitrogen with heating at 80° C. for 3 hrs.

The polymerization reaction mixture thus obtained was charged into 500 g of methanol to permit purification by precipitation, and thus resulting precipitate was dissolved in 20 g of PGMEA, to which 0.49 g of AIBN, 2.03 g of tert-dodecanethiol and 1 g of PGME were added, and the mixture was stirred under nitrogen with heating at 90° C. for 2 hrs.

A reaction mixture thus obtained was concentrated, followed by diluting with 10 g of THF and then purification by precipitation was permitted through introducing into 500 g of methanol. A resulting pale yellow solid was dried under reduced pressure to give 18.4 g of a polymer represented by the following formula (A-2). The polymer (A-2) had Mn of 7,100, Mw of 8,400 and Mw/Mn of 1.19. As a result of the $^{13}$C-NMR analysis, the proportion of each structural unit contained in the polymer (A-2) was as presented in the following formula (A-2), and a molar ratio of the styrene-derived unit (first structural unit) to the methyl methacrylate-derived unit (second structural unit) was 73.7:26.3.

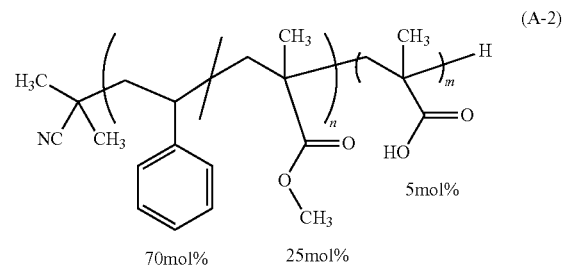

Synthesis Example 3

Into a 200-mL three-neck flask, 0.69 g of 2-cyano-2-propyldodecyl trithiocarbonate, 0.098 g of AIBN, 16.3 g of styrene, 7.22 g of methyl methacrylate and 40 g of anisole were added, and the mixture was stirred under nitrogen with heating at 80° C. for 5 hrs. Next, 1.46 mL of 2-hydroxyethyl methacrylate was added with a syringe and 0.098 g of AIBN was further added thereto, and the mixture was stirred under nitrogen with heating at 80° C. for 3 hrs.

The polymerization reaction mixture thus obtained was charged into 500 g of methanol to permit purification by precipitation, and thus resulting precipitate was dissolved in 20 g of PGMEA, to which 0.49 g of AIBN, 2.03 g of tert-dodecanethiol and 1 g of PGME were added, and the mixture was stirred under nitrogen with heating at 90° C. for 2 hrs.

A reaction mixture thus obtained was concentrated, followed by diluting with 10 g of THF and then purification by precipitation was permitted through charging into 500 g of methanol. A resulting pale yellow solid was dried under reduced pressure to give 18.9 g of a polymer represented by the following formula (A-3). The polymer (A-3) had Mn of 7,700, Mw of 9,300 and Mw/Mn of 1.21. As a result of the $^{13}$C-NMR analysis, the proportion of each structural unit contained in the polymer (A-3) was as presented in the following formula (A-3), and a molar ratio of the styrene-derived unit (first structural unit) to the methyl methacrylate-derived unit (second structural unit) was 68.4:31.6.

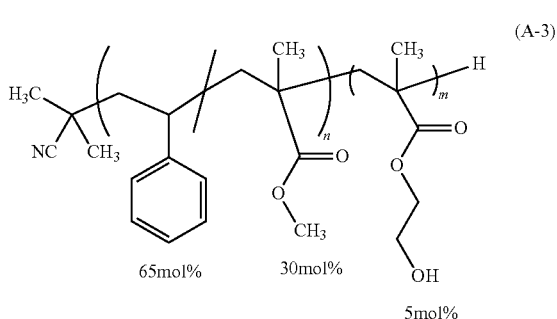

(A-3)

Synthesis Example 4

Into a 200-mL three-neck flask, 0.69 g of 2-cyano-2-propyldodecyl trithiocarbonate, 0.098 g of AIBN, 16.3 g of styrene, 7.21 g of methyl methacrylate and 40 g of anisole were added, and the mixture was stirred under nitrogen with heating at 80° C. for 5 hrs. Next, 2.01 mL of N,N-dimethylaminoethyl methacrylate was added with a syringe and 0.098 g of AIBN was further added thereto, and the mixture was stirred under nitrogen with heating at 80° C. for 3 hrs.

The polymerization reaction mixture thus obtained was charged into 500 g of methanol to permit purification by precipitation, and thus resulting precipitate was dissolved in 20 g of PGMEA, to which 0.49 g of AIBN, 2.03 g of tert-dodecanethiol and 1 g of PGME were added, and the mixture was stirred under nitrogen with heating at 90° C. for 2 hrs.

A reaction mixture thus obtained was concentrated, followed by diluting with 10 g of THF and then purification by precipitation was permitted through charging into 500 g of methanol. A resulting pale yellow solid was dried under reduced pressure to give 18.1 g of a polymer represented by the following formula (A-4). The polymer (A-4) had Mn of 6,500, Mw of 7,800 and Mw/Mn of 1.20. As a result of the $^{13}$C-NMR analysis, the proportion of each structural unit contained in the polymer (A-4) was as presented in the following formula (A-4), and a molar ratio of the styrene-derived unit (first structural unit) to the methyl methacrylate-derived unit (second structural unit) was 68.4:31.6.

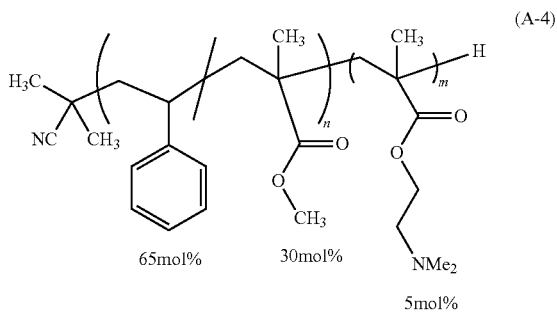

(A-4)

Synthesis Example 5

Into a 200-mL three-neck flask, 0.69 g of 2-cyano-2-propyldodecyl trithiocarbonate, 0.098 g of AIBN, 13.8 g of styrene, 9.60 g of methyl methacrylate and 40 g of anisole were added, and the mixture was stirred under nitrogen with heating at 80° C. for 5 hrs. Next, 2.01 mL of N,N-dimethylaminoethyl methacrylate was added with a syringe and 0.098 g of AIBN was further added thereto, and the mixture was stirred under nitrogen with heating at 80° C. for 3 hrs.

The polymerization reaction mixture thus obtained was charged into 500 g of methanol to permit purification by precipitation, and thus resulting precipitate was dissolved in 20 g of PGMEA, to which 0.49 g of AIBN, 2.03 g of tert-dodecanethiol and 1 g of PGME were added, and the mixture was stirred under nitrogen with heating at 90° C. for 2 hrs.

A reaction mixture thus obtained was concentrated, followed by diluting with 10 g of THF and then purification by precipitation was permitted through charging into 500 g of methanol. A resulting pale yellow solid was dried under reduced pressure to give 18.1 g of a polymer represented by the following formula (A-5). The polymer (-5) had Mn of 6,500, Mw of 8.300 and Mw/Mn of 1.27. As a result of the $^{13}$C-NMR analysis, the proportion of each structural unit contained in the polymer (A-5) was as presented in the following formula (A-5), and a molar ratio of the styrene-derived unit (first structural unit) to the methyl methacrylate-derived unit (second structural unit) was 57.9:42.1.

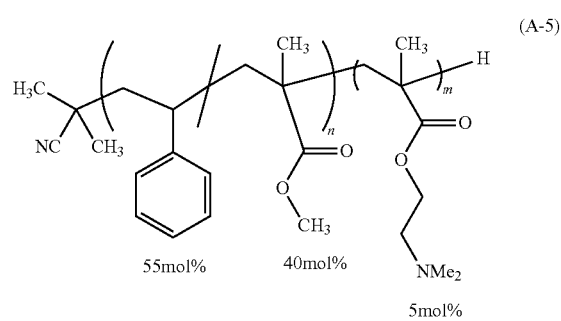

(A-5)

Synthesis Example 6

Into a 200-mL three-neck flask, 0.69 g of 2-cyano-2-propyldodecyl trithiocarbonate, 0.098 g of AIBN, 7.50 g of styrene, 15.6 g of methyl methacrylate and 40 g of anisole were added, and the mixture was stirred under nitrogen with heating at 80° C. for 5 hrs. Next, 2.01 mL of N,N-dimethylaminoethyl methacrylate was added with a syringe and 0.098 g of AIBN was further added thereto, and the mixture was stirred under nitrogen with heating at 80° C. for 3 hrs.

The polymerization reaction mixture thus obtained was charged into 500 g of methanol to permit purification by precipitation, and thus resulting precipitate was dissolved in 20 g of PGMEA, to which 0.49 g of AIBN, 2.03 g of tert-dodecanethiol and 1 g of PGME were added, and the mixture was stirred under nitrogen with heating at 90° C. for 2 hrs.

A reaction mixture thus obtained was concentrated, followed by diluting with 10 g of THF and then purification by precipitation was permitted through charging into 500 g of methanol. A resulting pale yellow solid was dried under reduced pressure to give 18.2 g of a polymer represented by the following formula (A-6). The polymer (A-6) had Mn of 6,800, Mw of 8,300 and Mw/Mn of 1.22. As a result of the $^{13}$C-NMR analysis, the proportion of each structural unit contained in the polymer (A-6) was as presented in the following formula (A-6), and a molar ratio of the styrene-derived unit (first structural unit) to the methyl methacrylate-derived unit (second structural unit) was 31.6:68.4.

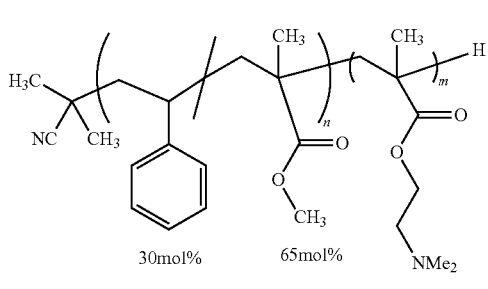

(A-6)

30mol%   65mol%   NMe₂
                  5mol%

Synthesis Example 7

Into a 200-mL three-neck flask, 0.69 g of 2-cyano-2-propyldodecyl trithiocarbonate, 0.098 g of AIBN, 7.50 g of styrene, 15.6 g of methyl methacrylate and 40 g of anisole were added, and the mixture was stirred under nitrogen with heating at 80° C. for 5 hrs. Next, 1.46 mL of 2-hydroxyethyl methacrylate was added with a syringe and 0.098 g of AIBN was further added thereto, and the mixture was stirred under nitrogen with heating at 80° C. for 3 hrs.

The polymerization reaction mixture thus obtained was charged into 500 g of methanol to permit purification by precipitation, and thus resulting precipitate was dissolved in 20 g of PGMEA, to which 0.49 g of AIBN, 2.03 g of tert-dodecanethiol and 1 g of PGME were added, and the mixture was stirred under nitrogen with heating at 90° C. for 2 hrs.

A reaction mixture thus obtained was concentrated, followed by diluting with 10 g of THF and then purification by precipitation was permitted through charging into 500 g of methanol. A resulting pale yellow solid was dried under reduced pressure to give 18.1 g of a polymer represented by the following formula (A-7). The polymer (A-7) had Mn of 6,800, Mw of 8,300 and Mw/Mn of 1.22. As a result of the ¹³C-NMR analysis, the proportion of each structural unit contained in the polymer (A-7) was as presented in the following formula (A-7), and a molar ratio of the styrene-derived unit (first structural unit) to the methyl methacrylate-derived unit (second structural unit) was 31.6:68.4.

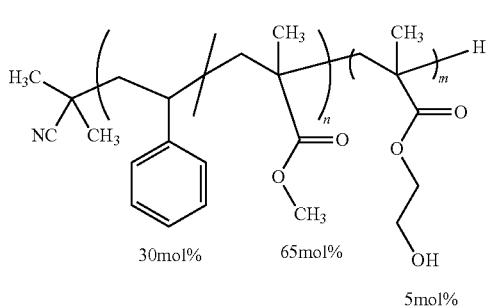

(A-7)

30mol%   65mol%   OH
                  5mol%

Synthesis Example 8

Into a 200-mL three-neck flask, 0.69 g of 2-cyano-2-propyldodecyl trithiocarbonate, 0.098 g of AIBN, 7.50 g of styrene, 15.6 g of methyl methacrylate and 40 g of anisole were added, and the mixture was stirred under nitrogen with heating at 80° C. for 5 hrs. Next, 0.098 g of AIBN (0.6 mmol) was added, and the mixture was stirred under nitrogen with heating at 80° C. for 3 hrs.

The polymerization reaction mixture thus obtained was charged into 500 g of methanol to permit purification by precipitation, and thus resulting precipitate was dissolved in 20 g of PGMEA, to which 0.49 g of AIBN, 2.03 g of tert-dodecanethiol and 1 g of PGME were added, and the mixture was stirred under nitrogen with heating at 90° C. for 2 hrs.

A reaction mixture thus obtained was concentrated, followed by diluting with 10 g of THF and then purification by precipitation was permitted through charging into 500 g of methanol. A resulting pale yellow solid was dried under reduced pressure to give 18.0 g of a polymer represented by the following formula (A-8). The polymer (A-8) had Mn of 6,500, Mw of 8,000 and Mw/Mn of 1.23. As a result of the ¹³C-NMR analysis, the proportion of each structural unit contained in the polymer (A-8) was as presented in the following formula (A-8), and a molar ratio of the styrene-derived unit (first structural unit) to the methyl methacrylate-derived unit (second structural unit) was 32:68.

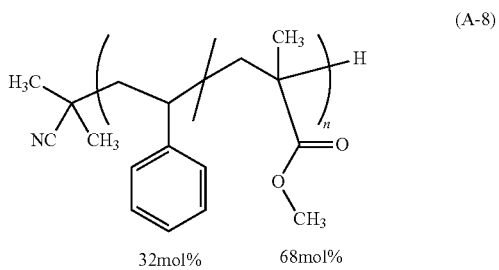

(A-8)

32mol%   68mol%

Synthesis Example 9

Into a 200-mL three-neck flask, 0.69 g of 2-cyano-2-propyldodecyl trithiocarbonate, 0.098 g of AIBN, 17.5 g of styrene, 7.22 g of methyl methacrylate and 40 g of anisole were added, and the mixture was stirred under nitrogen with heating at 80° C. for 5 hrs. Next, 0.098 g of AIBN was added, and the mixture was stirred under nitrogen with heating at 80° C. for 3 hrs.

The polymerization reaction mixture thus obtained was charged into 500 g of methanol to permit purification by precipitation, and thus resulting precipitate was dissolved in 20 g of PGMEA, to which 1.47 g of n-butylamine and 2 g of propylene glycol monomethyl ether were added, and the mixture was stirred under nitrogen with heating at 50° C. for 3 hrs.

A reaction mixture thus obtained was concentrated, followed by diluting with 10 g of THF and then purification by precipitation was permitted through charging into 500 g of methanol. A resulting pale yellow solid was dried under reduced pressure to give 18.7 g of a polymer (a-9) having an —SH group at an end.

To 3.00 g of the polymer (a-9), 0.69 g of N,N-dimethylallylamine, 10 g of propylene glycol monomethyl ether acetate and 0.164 g of AIBN were added, and the mixture was stirred under nitrogen with heating at 60° C. for 5 hrs. A reaction mixture thus obtained was concentrated, followed by diluting with 10 g of THF and then purification by precipitation was permitted through charging into 500 g of methanol. A resulting white solid was dried under reduced pressure to give a polymer represented by the following formula (A-9). The polymer (A-9) had Mn of 7,600, Mw of 9,200 and Mw/Mn of 1.21. As a result of the $^{13}$C-NMR analysis, the proportion of each structural unit contained in the polymer (A-9) was as presented in the following formula (A-9), and a molar ratio of the styrene-derived unit (first structural unit) to the methyl methacrylate-derived unit (second structural unit) was 70:30.

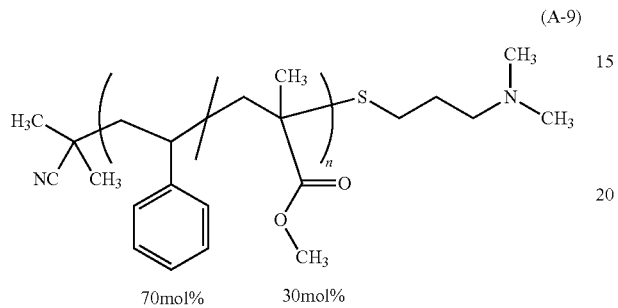

(A-9)

70mol%    30mol%

Synthesis Example 10

Into a 200-mL three-neck flask, 0.69 g of 2-cyano-2-propyldodecyl trithiocarbonate, 0.098 g of AIBN, 17.5 g of styrene, 7.22 g of methyl methacrylate and 40 g of anisole were added, and the mixture was stirred under nitrogen with heating at 80° C. for 5 hrs. Next, 0.098 g of AIBN was added, and the mixture was stirred under nitrogen with heating at 80° C. for 3 hrs.

The polymerization reaction mixture thus obtained was charged into 500 g of methanol to permit purification by precipitation, and thus resulting precipitate was dissolved in 20 g of PGMEA, to which 1.47 g of n-butylamine and 2 g of propylene glycol monomethyl ether were added, and the mixture was stirred under nitrogen with heating at 50° C. for 3 hrs.

A reaction mixture thus obtained was concentrated, followed by diluting with 10 g of THF and then purification by precipitation was permitted through charging into 500 g of methanol. A resulting pale yellow solid was dried under reduced pressure to give 18.3 g of a polymer (a-10) having an —SH group at an end.

To 3.00 g of the polymer (a-10), 0.58 g of 3-buten-1-ol, 10 g of propylene glycol monomethyl ether acetate and 0.164 g of AIBN were added, and the mixture was stirred under nitrogen with heating at 60° C. for 5 hrs. A reaction mixture thus obtained was concentrated, followed by diluting with 10 g of THF and then purification by precipitation was permitted through charging into 500 g of methanol. A resulting white solid was dried under reduced pressure to give a polymer represented by the following formula (A-10). The polymer (A-10) had Mn of 7,500, Mw of 9,150 and Mw/Mn of 1.20. As a result of the $^{13}$C-NMR analysis, the proportion of each structural unit contained in the polymer (A-10) was as presented in the following formula (A-10), and a molar ratio of the styrene-derived unit (first structural unit) to the methyl methacrylate-derived unit (second structural unit) was 70:30.

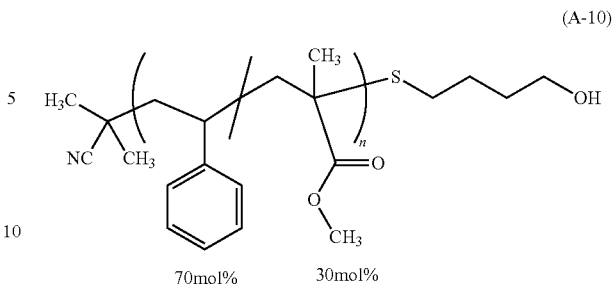

(A-10)

70mol%    30mol%

Synthesis of Polymer (P)

Synthesis Example 11: Synthesis of Polystyrene Brush

After a 500-mL flask as a reaction vessel was dried under reduced pressure, 120 g of THF which had been subjected to a dehydrating treatment by distillation in a nitrogen atmosphere was charged and cooled to −78° C. on an dry ice-acetone bath. Thereafter, 3.10 mL of a 1 N cyclohexane solution of sec-butyllithium (sec-BuLi) was charged to the THF, and then 16.6 mL of styrene which had been subjected to adsorptive filtration by silica gel for removing a polymerization inhibitor and to a dehydrating treatment by distillation was charged over 30 min by dropwise addition. The polymerization system was confirmed to have an orange color. In the charging by dropwise addition, an attention was paid such that the internal temperature of the reaction solution was not elevated to no less than −60° C. After completion of the dropwise addition, aging was allowed for 30 min. Subsequently, 0.63 mL of 2-ethylhexyl glycidyl ether and 1 mL of methanol as chain-end terminators were charged to conduct a terminating reaction of polymerizable ends. The temperature of this reaction solution was elevated to a room temperature, and a reaction solution thus obtained was concentrated and substitution with methyl isobutyl ketone (MIBK) was carried out. Then, 1,000 g of a 2% by mass aqueous oxalic acid solution was charged with stirring, and after the mixture was left to stand, an aqueous under layer was eliminated. This operation was repeated three times to remove a Li salt. Thereafter, 1,000 g of ultra pure water was charged with stirring, and an aqueous under layer was eliminated. After this operation was repeated three times to remove oxalic acid, a thus resulting solution was concentrated and added to 500 g of methanol dropwise, whereby a polymer was precipitated, and the solid was collected on a Buechner funnel. The polymer was dried at 60° C. under reduced pressure to give 14.8 g of a polymer (P-1) that is white and is a polystyrene having an alcoholic hydroxyl group derived from 2-ethylhexyl glycidyl ether at an end.

The polymer (P-1) had Mw of 6,100, Mn of 5,700 and Mw/Mn of 1.07.

Synthesis of Polymer (X)

Synthesis Example 12: Synthesis of Block Copolymer

After a 500-mL flask as a reaction vessel was dried under reduced pressure, 200 g of THF which had been subjected to a dehydrating treatment by distillation in a nitrogen atmosphere was charged and cooled to −78° C. on an dry ice-acetone bath. Thereafter, 0.40 mL of a 1 N cyclohexane solution of sec-butyllithium (sec-BuLi) was charged to the THF, and then 22.1 mL of styrene which had been subjected to adsorptive filtration by silica gel for removing a polymerization inhibitor and to a dehydrating treatment by distillation was charged over 30 min by dropwise addition, while an attention was paid such that the internal temperature of the reaction solution was not elevated to no less than −60° C. After the mixture was stirred for 30 min, 0.15 mL of 1,1-diphenylethylene and 1.42 mL of a 0.5 N THF solution of lithium chloride were added thereto. Furthermore, 18.0 mL of methyl methacrylate which had been subjected to adsorptive filtration by silica gel for removing a polymerization inhibitor and to a dehydrating treatment by distillation was charged over 30 min by dropwise addition to this solution, and then a reaction was allowed for 120 min. Subsequently, 1 mL of methanol as a chain-end terminator was charged to conduct a terminating reaction of polymerizable ends. The temperature of this reaction solution was elevated to a room temperature, and a reaction solution thus obtained was concentrated and substitution with MIBK was carried out. Then, 1,000 g of a 2% by mass aqueous oxalic acid solution was charged with stirring, and after the mixture was left to stand, an aqueous under layer was eliminated. A Li salt was removed by this operation. Thereafter, 1,000 g of ultra pure water was charged with stirring, and an aqueous under layer was eliminated. Oxalic acid was removed by this operation, and a thus resulting solution was concentrated and added to 500 g of methanol dropwise, whereby a polymer was precipitated. The solid was collected on a Buechner funnel, and then washed with cyclohexane to collect the solid again on a Buechner funnel. The solid was dried at 60° C. under reduced pressure to give 37.4 g of a white block copolymer (X-1).

The block copolymer (X-1) had Mw of 58,600, Mn of 57,000 and Mw/Mn of 1.03. In addition, as a result of the $^{13}$C-NMR analysis, the proportions of the repeating unit derived from styrene (PS) and the repeating unit derived from methyl methacrylate (PMMA) contained in the block copolymer (X-1) were 50.0% by mass (50.0 mol %) and 50.0% by mass (50.0 mol %), respectively. It is to be noted that the block copolymer (X-1) is a diblock copolymer.

Preparation of Composition for Underlayer Film Formation

The solvent (S) used in preparing the compositions for underlayer film formation is as presented below.

(S) Solvent
S-1: propylene glycol monomethyl ether acetate
S-2: ethyl lactate

Preparation Example 1

A composition for underlayer film formation (S-1) was prepared by adding 98.8 g of (S-1) as the solvent (S) to 1.2 g of (A-1) as the polymer (A), stirring the mixture, and then filtering the mixture through a high-density polyethylene filter having fine pores of 0.45 m.

Preparation Examples 2 to 12

Compositions for underlayer film formation (S-2) to (S-12) were prepared in a similar manner to Preparation Example 1 except that each component of the type and in the amount shown in Table 1 below was used.

TABLE 1

| Amount (g) | | Preparation Example | | | | | | | | | | | |
|---|---|---|---|---|---|---|---|---|---|---|---|---|---|
| | | 1 | 2 | 3 | 4 | 5 | 6 | 7 | 8 | 9 | 10 | 11 | 12 |
| Composition for underlayer film formation | | S-1 | S-2 | S-3 | S-4 | S-5 | S-6 | S-7 | S-8 | S-9 | S-10 | S-11 | S-12 |
| (A) Polymer | A-1 | 1.2 | 1.2 | | | | | | | | | | |
| | A-2 | | | 1.2 | 1.2 | | | | | | | | |
| | A-3 | | | | | 1.2 | | | | | | | |
| | A-4 | | | | | | 1.2 | | | | | | |
| | A-5 | | | | | | | 1.2 | | | | | |
| | A-6 | | | | | | | | 1.2 | | | | |
| | A-7 | | | | | | | | | 1.2 | | | |
| | A-8 | | | | | | | | | | 1.2 | | |
| | A-9 | | | | | | | | | | | 1.2 | |
| | A-10 | | | | | | | | | | | | 1.2 |
| (B) Solvent | B-1 | 98.8 | 80 | 98.8 | 80 | 98.8 | 98.8 | 98.8 | 98.8 | 98.8 | 98.8 | 98.8 | 98.8 |
| | B-2 | | 18.8 | | 18.8 | | | | | | | | |

Pattern Formation

Examples 1 to 9 and Comparative Examples 1 to 3

Formation of Silicon-Containing Film and Prepattern

A Spin on Glass material ("NFC ISX568" available from JSR Corporation) was applied to have a thickness of 40 nm on a 300-mm wafer by using "Clean Track-12" available from Tokyo Electron Limited, and subjected to baking under nitrogen at 220° C. for 90 sec. Next, the polystyrene brush (polymer (P-1)) synthesized as described above was applied to have a thickness of 30 nm on SiARC formed. After allowing for brush formation by baking at 250° C. for 3 min, unreacted materials were removed by rinsing with PGMEA. Then, an ArF liquid immersion resist ("AEX 1191JN" available from JSR Corporation) was applied to have a thickness of 50 nm, and subjected to prebaking at 100° C. for 1 min. Subsequently, an exposure was carried out by an exposure device ("XT 1950i scanner" available from ASML Co., (NA: 1.35, dipole illuminance σou/σin 0.76/0.66)), followed by as post exposure baking at 100° C. for 1 min. Development was carried out with butyl acetate for 30 sec to produce an LS pattern with a pitch of 90 nm.

This wafer was subjected to oxygen/argon plasma etching in order to remove the resist pattern (apparatus: "NZ-1300" available from ULVAC, Inc., electric power supply employed: MW (microwave electric power supply), degree of vacuum: 50 mtorr, 15 sec/O$_2$, 100 secm/Ar, power: 50 W) to produce trenches by the etching.

Furthermore, the resist pattern was etched by "RIE-1701 reactive Ion Etch Plasma System" available from Nordson MARCH, Inc.". Thereafter, in order to remove the resist material completely, immersion in RSD-001 at normal temperature was carried out for 15 min, followed by rinsing with PGMEA, and blowing with air, whereby a wafer having the formed prepattern was produced.

Formation of Underlayer Film

On the wafer having the formed prepattern thus produced, the composition for underlayer film formation prepared as described above was applied to have a thickness of 30 nm, which was subjected to a heat treatment at 200° C. for 3 min, followed by rinsing with PGMEA, and blowing with air, whereby an underlayer film was formed on the trenches.

Formation of Directed Self-Assembled Film

A composition for directed self-assembled film formation (PS-block-PMMA 30 nm P_LS) prepared by dissolving 1.3 g of the block copolymer (polymer (X-1)) synthesized as described above in 98.7 g of propylene glycol monomethyl ether acetate was applied to have a thickness of 35 nm, and subjected to thermal annealing under nitrogen at 250° C. for 5 min, thereby allowing phase separation of the coating film to form a directed self-assembled film.

Evaluations

Orientational arrangement was observed by using "CG-6300" available from Hitachi High-Technologies Corporation, and pitch size (L0) was measured. For the pitch analysis, an analysis based on "Freq analyzer DSA" produced by IMEC on the basis of MATLAB 2017b was performed. The orientationality in arrangement was evaluated to be: "A" (favorable) when orientational arrangement was found; and "B" (unfavorable) when neither a fingerprint pattern nor a pattern was found. In addition, measurements of L0 (nm) are shown together in Table 2 below.

TABLE 2

|  | Composition for underlayer film formation | Orientationality in arrangement | L0 (nm) |
| --- | --- | --- | --- |
| Example 1 | S-1 | A | 30 |
| Example 2 | S-2 | A | 29.9 |
| Example 3 | S-3 | A | 30 |
| Example 4 | S-4 | A | 30 |
| Example 5 | S-5 | A | 30 |
| Example 6 | S-6 | A | 29.9 |
| Example 7 | S-7 | A | 30 |
| Example 8 | S-11 | A | 30 |
| Example 9 | S-12 | A | 30 |
| Comparative Example 1 | S-8 | B | 30 |
| Comparative Example 2 | S-9 | B | 29.9 |
| Comparative Example 3 | S-10 | B | No pattern |

As can be seen from the results shown in Table 2, the pattern-forming methods of Examples enabled the orientationality in arrangement of the phase separation structure by directed self-assembly to be favorable. On the other hand, the pattern-forming methods of Comparative Examples failed to form the fingerprint pattern and the pattern.

According to the pattern-forming method of the embodiment of the present invention, a phase separation structure by directed self-assembly is formed, the phase separation structure being superior in orientationality in arrangement, and by using this phase separation structure, a substrate having a favorable pattern can be obtained. The patterned substrate of the embodiment of the present invention has a favorable pattern due to use of the phase separation structure by directed self-assembly, the phase separation structure having been formed by the pattern-forming method and being superior in orientationality in arrangement. Therefore, these can be suitably used for lithography processes in manufacture of various types of electronic devices such as semiconductor devices and liquid crystal devices for which further microfabrication is demanded.

Obviously, numerous modifications and variations of the present invention are possible in light of the above teachings. It is therefore to be understood that within the scope of the appended claims, the invention may be practiced otherwise than as specifically described herein.

What is claimed is:

1. A pattern-forming method, comprising:
applying a silicon-containing composition for a silicon-containing film on a substrate such that the silicon-containing film is formed on the substrate;

forming a prepattern having recessed portions and comprising a first polymer directly or indirectly on the silicon-containing film;

forming an underlayer film comprising a second polymer in the recessed portions of the prepattern such that the underlying film is formed on the silicon-containing film exposed in the recessed portions of the prepattern;

applying, on the underlayer film and the prepattern, a composition for a directed self-assembled film comprising a third polymer such that a coating film comprising the composition for the directed self-assembled film is formed;

allowing phase separation of the coating film to form the directed self-assembled film having phases on the underlayer film and the prepattern;

removing at least a part of the phases of the directed self-assembled film to form a pattern on the underlayer film and the prepattern; and etching the substrate using the pattern as a mask on the underlayer film and the prepattern, wherein the first polymer comprises a first structural unit, the second polymer comprises a molecular chain comprising the first structural unit, a second structural unit, and an end structure bonding to one end of the molecular chain and comprises at least one selected from the group consisting of an amino group, a hydroxy group and a carboxy group such that the first structural unit and the second structural unit are randomly aligned, the third polymer is a block copolymer comprising a block of the first structural unit and a block of the second structural unit, and the first structural unit is derived from a first monomer, and the second structural unit is derived from a second monomer that is more polar than the first monomer.

2. The pattern-forming method according to claim 1, wherein the end structure in the second polymer is formula (1) or formula (2),

where L is a trivalent group having 1 to 20 carbon atoms, $A^1$ is a monovalent group comprising an amino group, a hydroxy group or a carboxy group, X is a hydrogen atom, a monovalent organic group having 1 to 20 carbon atoms, —SH or —S—$A^{11}$, wherein $A^{11}$ is a monovalent group comprising an amino group, a hydroxy group or a carboxy group, n is an integer of no less than 2,* denotes a site bonding to the end of the molecular chain, $A^2$ is a monovalent group comprising an amino group, a hydroxy group or a carboxy group, and m is 0 or 1.

3. The pattern-forming method according to claim 2, wherein the end structure is the formula (1) having formula (A),

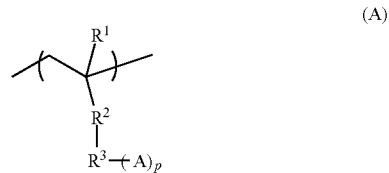

where $R^1$ is a hydrogen atom, a fluorine atom or a monovalent organic group having 1 to 20 carbon atoms, $R^2$ is a single bond, —O— or —COO—, p is an integer of 1 to 3, $R^3$ is a single bond, or a substituted or unsubstituted divalent hydrocarbon group having 1 to 20 carbon atoms when p is 1, $R^3$ is a substituted or unsubstituted hydrocarbon group having 1 to 20 carbon atoms and having a valency of (1+p) when p is no less than 2, and A is an amino group, a hydroxy group or a carboxy group and is identical or different when p is no less than 2.

4. The pattern-forming method according to claim 3, wherein the second polymer includes a third structural unit in a proportion of no less than 0.1 mol % and no greater than 30 mol % in the second polymer.

5. The pattern-forming method according to claim 1, wherein the first monomer is a vinyl aromatic compound.

6. The pattern-forming method according to claim 1, wherein the second monomer is a (meth)acrylic acid ester.

7. The pattern-forming method according to claim 1, wherein the end structure in the second polymer comprises an amino group, and the amino group is a tertiary amino group.

8. The pattern-forming method according to claim 1, wherein a molar ratio of the first structural unit to the second structural unit in the second polymer is no less than 60/40 and no greater than 80/20.

9. The pattern-forming method according to claim 1, wherein a composition forming the underlayer film comprises a solvent comprising a lactic acid ester.

10. The pattern-forming method according to claim 1, wherein a line-and-space pattern or a hole pattern is formed as the pattern.

11. A patterned substrate obtained by a process comprising the pattern-forming method of claim 1.

12. The pattern-forming method according to claim 1, wherein the end structure in the second polymer comprises an amino group.

13. The pattern-forming method according to claim 12, wherein the first monomer is a vinyl aromatic compound.

14. The pattern-forming method according to claim 12, wherein the second monomer is a (meth)acrylic acid ester.

15. The pattern-forming method according to claim 12, wherein a molar ratio of the first structural unit to the second structural unit in the second polymer is no less than 60/40 and no greater than 80/20.

16. The pattern-forming method according to claim 12, wherein a composition forming the underlayer film comprises a solvent comprising a lactic acid ester.

17. The pattern-forming method according to claim 1, wherein the end structure in the second polymer is formula (1) or formula (2),

where L is a trivalent group having 1 to 20 carbon atoms, $A^1$ is a monovalent group comprising an amino group, X is a hydrogen atom, a monovalent organic group having 1 to 20 carbon atoms, —SH or —S—$A^{11}$, $A^{11}$ is a monovalent group comprising an amino group, a hydroxy group or a carboxy group, n is an integer of no less than 2, * denotes a site bonding to the end of the molecular chain, $A^2$ is a monovalent group comprising an amino group, and m is 0 or 1.

18. The pattern-forming method according to claim 17, wherein the end structure is the formula (1) having formula (A),

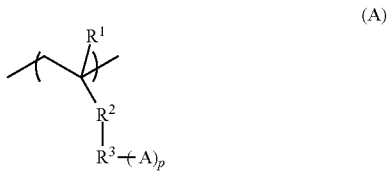

where $R^1$ is a hydrogen atom, a fluorine atom or a monovalent organic group having 1 to 20 carbon atoms, $R^2$ is a single bond, —O— or —COO—, p is an integer of 1 to 3, $R^3$ is a single bond, or a substituted or unsubstituted divalent hydrocarbon group having 1 to 20 carbon atoms when p is 1, $R^3$ is a substituted or unsubstituted hydrocarbon group having 1 to 20 carbon atoms and having a valency of (1+p) when p is no less than 2, and A is an amino group and is identical or different when p is no less than 2.

19. The pattern-forming method according to claim 1, wherein the second polymer includes a third structural unit in a proportion of no less than 0.1 mol % and no greater than 30 mol % in the second polymer.

20. The pattern-forming method according to claim 1, wherein the silicon-containing composition comprises a polysiloxane and a solvent.

* * * * *